United States Patent
Weber et al.

(10) Patent No.: US 7,311,769 B2
(45) Date of Patent: Dec. 25, 2007

(54) PIGMENT COMPOSITIONS CONSISTING OF A YELLOW DISAZO PIGMENT AND AN ORGANIC PIGMENT

(75) Inventors: Joachim Weber, Reinach (CH); Gerhard Wilker, Moerfelden-Walldorf (DE); Frank Alfter, Bad Soden (DE); Hans-Tobias Macholdt, Darmstadt-Eberstadt (DE)

(73) Assignee: Clariant Produkte (Deutschland) GmbH, Sulzbach (DE)

( * ) Notice: Subject to any disclaimer, the term of this patent is extended or adjusted under 35 U.S.C. 154(b) by 25 days.

(21) Appl. No.: 10/579,344

(22) PCT Filed: Nov. 11, 2004

(86) PCT No.: PCT/EP2004/012788

§ 371 (c)(1),
(2), (4) Date: May 12, 2006

(87) PCT Pub. No.: WO2005/049737

PCT Pub. Date: Jun. 2, 2005

(65) Prior Publication Data

US 2007/0125263 A1 Jun. 7, 2007

(30) Foreign Application Priority Data

Nov. 14, 2003 (DE) ................ 103 53 127

(51) Int. Cl.
| | |
|---|---|
| C09B 67/22 | (2006.01) |
| C09D 11/00 | (2006.01) |
| C08K 5/00 | (2006.01) |
| G03G 9/09 | (2006.01) |
| G03F 7/00 | (2006.01) |

(52) U.S. Cl. ............... 106/494; 106/31.75; 106/31.77; 106/495; 106/496; 47/57.6; 430/7; 430/107.1; 430/108.23; 524/90; 524/190

(58) Field of Classification Search ............ 106/31.75, 106/31.77, 31.81, 494, 495, 496; 47/57.6; 430/7, 107.1, 108.23; 524/90, 190
See application file for complete search history.

(56) References Cited

U.S. PATENT DOCUMENTS

| | | | | |
|---|---|---|---|---|
| 4,070,353 | A | * | 1/1978 | Cseh et al. .................. 534/748 |
| 5,030,247 | A | | 7/1991 | Goldmann |
| 5,559,216 | A | * | 9/1996 | Jung et al. ................ 106/31.75 |
| 5,883,167 | A | * | 3/1999 | Medinger et al. ............ 524/190 |
| 6,117,606 | A | | 9/2000 | Macholdt et al. |
| 6,504,045 | B2 | | 1/2003 | Jung et al. |
| 6,602,342 | B2 | | 8/2003 | Schmidt et al. |
| 2002/0065402 | A1 | | 5/2002 | Jung et al. |
| 2006/0167236 | A1 | | 7/2006 | Schupp et al. |

FOREIGN PATENT DOCUMENTS

| | | |
|---|---|---|
| DE | 10045790 | 3/2002 |
| EP | 0585873 | 3/1994 |
| EP | 0908789 | 4/1999 |
| EP | 1188800 | 3/2002 |
| GB | 1328861 | 9/1973 |
| WO | WO 2005/049738 A1 * | 6/2005 |

OTHER PUBLICATIONS

CAS Abstract No. 107:238569, abstract of Czech. Patent No. CS 219960B1 (Oct. 1985).*
CAS Abstract No. 109:130807, abstract of Czech. Patent No. CS 246533B1 (Dec. 1987).*
CAS Abstract No. 115:116292, abstract of Czech. Patent No. CS 266632B1 (Aug. 1990).*
U.S. Appl. No. 10/582,770 by Grimm et al., filed Jun. 12, 2006.
U.S. Appl. No. 10/579,345 by Weber et al., filed May 12, 2006.
International Search Report for PCT/EP 2004/012788, mailed Jan. 10, 2005.
English Abstract for JP 2003232914, published Aug. 22, 2003.
English Abstract for JP 2003 240938, published Aug. 27, 2003.
English Translation of International Preliminary Report on Patentability for PCT/EP 2004/012788, mailed Sep. 8, 2006.
U.S. Appl. No. 10/582,769, by Grimm et al., filed Jun. 12, 2006.

* cited by examiner

*Primary Examiner*—Anthony J. Green
(74) *Attorney, Agent, or Firm*—Anthony A. Bisulca

(57) ABSTRACT

A pigment composition containing a disazo pigment of formula (I) and at least one pigment from the group of organic orange, red and violet pigments

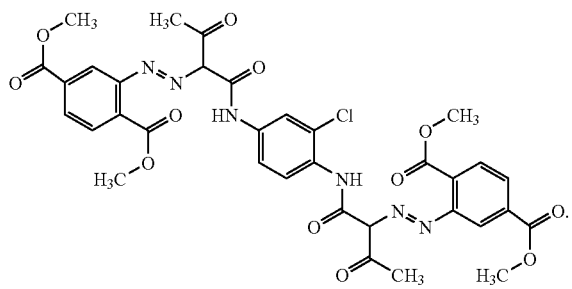

11 Claims, No Drawings

PIGMENT COMPOSITIONS CONSISTING OF A YELLOW DISAZO PIGMENT AND AN ORGANIC PIGMENT

This invention relates to pigment compositions consisting of a yellow disazo pigment and an organic orange, red or violet pigment and their use for coloration of macromolecular materials.

Pigments to be used for coloration of macromolecular organic materials have to meet high requirements with regard to their performance characteristics, such as easy dispersibility, use-appropriate flowability of coatings, high color strength, overcoating fastness, solvent fastness, resistance to alkali and acid, light and weather fastnesses and cleanness of hue. Another desideratum is an ideally universal utility for coloration of other macromolecular systems, such as plastics and printing inks for example. In this case, there are additional requirements, some of which are also expected of coatings, examples being high fastnesses such as bleedout fastness and heat stabilities. In the case of coatings and printing inks, utility both in waterborne and solventborne systems is desired. The trend in the manufacture of pigment suspensions is toward high pigment concentrations, the demand is therefore for highly pigmented coating and printing ink concentrates or millbases having nonetheless a low viscosity. Fields of use for pigments further include for example electrophotographic toners, other kinds of inks, color filters or powder coatings, which each have their additional specific requirements.

JP 2003-232914 discloses pigment compositions comprising C.I. Pigment Yellow 214.

Owing to the pigments' inherent color, most hues are only achievable by mixing two or more pigments. There are certain hues, particularly orange hues, and also when one component is used in small amount to match the hue, where existing solutions do not meet all the requirements.

There is a need for pigment compositions that overcome the disadvantages of existing pigment compositions and meet the abovementioned requirements.

The present invention provides pigment compositions comprising a disazo pigment of the formula (I)

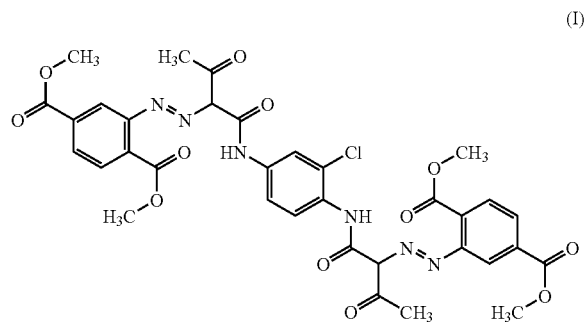

(I)

and one or more, for example one, two or three, pigments from the group of the organic orange, red and violet pigments.

The organic red and orange pigment in the composition of the present invention may be C.I. Pigment Orange 5, 13, 14, 16, 34, 36, 38, 42, 43, 48, 49, 51, 61, 62, 64, 67, 68, 69, 71, 72, 73, 74; C.I. Pigment Red 1, 2, 3, 4, 5, 7, 9, 12, 14, 23, 38, 41, 42, 48, 48:1, 48:2, 48:3, 48:4, 48:5, 48:6, 49, 49:1, 51:1, 52:1, 52:2, 53, 53:1, 53:3, 57, 57:1, 57:2, 57:3, 58:2, 58:4, 63:1, 81, 81:1, 81:2, 81:3, 81:4, 81:5, 81:6, 88, 112, 122, 123, 144, 146, 148, 149, 150, 166, 168, 169, 170, 175, 176, 177, 178, 179, 184, 185, 187, 188, 190, 192, 194, 200, 200:1, 202, 206, 207, 208, 209, 210, 214, 216, 220, 221, 224, 242, 246, 247, 251, 253, 254, 255, 256, 257, 260, 262, 264, 270, 272; C.I. Pigment Violet 19.

Preferred organic red pigments are C.I. Pigment Red 7, 12, 14, 41, 48:1, 48:2, 48:3, 48:4, 81:1, 81:2, 81:3, 122, 146, 168, 177, 178, 179, 184, 185, 187, 200, 202, 206, 207, 208, 209, 210, 246, 254, 255, 257, 264, 272, especially C.I. Pigment Red 122, 168, 177, 178, 179, 202, 209, 254, 255, 257, 264, 272.

Preferred organic orange pigments are C.I. Pigment Orange 43, 64, 71 and 73.

The preferred organic violet pigment is C.I. Pigment Violet 19 in the gamma phase.

In the pigment compositions of the present invention, the disazo pigment of the formula (I) and the organic orange, red or violet pigment may form a joint crystal lattice, for example in the form of solid solutions or mixed crystals.

The pigment compositions of the present invention give hues ranging from yellowish red to orange to reddish yellow. They are particularly interesting for hues in the yellowish red region and in the orange region.

In the pigment compositions of the present invention, the weight ratio of disazo pigment of formula (I) to organic orange, red or violet pigment may be (0.1:99.9) to (99.9:0.1), preferably (1:99) to (99:1), more preferably (5:95) to (95:5) and especially (10:90) to (90:10).

The pigment compositions of the present invention can be produced in various ways, for example by mixing the dry components in granule or powder form before or after a grinding operation, by adding one component in a moist form to the other component in a moist or dry form, for example by mixing the components in the form of the moist presscakes.

Mixing can be effected for example by acid pasting, acid swelling, by grinding in dry form, in moist form, for example by kneading, or in suspension, or by a combination thereof. Grinding can be carried out in the presence of water, solvents, acids or grinding assistants such as salt.

Mixing can also be effected by adding one component to the other component during the manufacturing operation of one of the components.

The manufacturing operation of the disazo pigment of formula (I) comprises the diazotization of the parent aromatic amine to form the diazonium salt, if appropriate the dissolving and appropriately precipitating of the parent coupling component, the mixing of the two reactants diazonium salt and coupling component, for which the coupling component may be added to the diazonium salt or vice versa, or else a continuous azo coupling may be carried out, if appropriate in a microreactor. The resulting coupling suspension can be subjected to an after treatment, for example after addition of solvent, under elevated temperature and/or pressure. The manufacturing process further comprises the isolation of the coupling product and if appropriate an after treatment of the coupling product in an aqueous, aqueous-organic or organic medium under elevated temperature, if appropriate under pressure, with subsequent isolation of the azo pigment as a presscake and its drying and if appropriate a grinding operation to convert a granular product into a powder.

When the organic orange or red pigment is an azo pigment, the manufacturing process will correspond to that described above.

When the organic orange, red or violet pigment is a polycyclic pigment, the disazo pigment of the formula (I)

will be added in the usual manner, after the chemical synthesis of the ring system of the organic orange, red or violet pigment is complete, since this chemical synthesis usually takes place under reaction conditions which can lead to a decomposition of the disazo pigment of the formula (I). After the chemical synthesis, the organic orange, red or violet pigment is comminuted if appropriate, for example by acid pasting, acid swelling, dry or wet grinding. The finely crystalline obtained or as-synthesized organic orange, red and violet pigments are usually subjected to an after treatment, generally known as a finish, for example in water and/or solvents and usually under elevated temperature and if appropriate elevated pressure.

Drying may utilize the known drying assemblies, such as drying cabinets, paddle wheel dryers, tumble dryers, contact dryers and especially spin flash and spray dryers. Through the choice of suitable drying assembly, it is also possible to produce low-dust and flowable powders or granules.

The pigment compositions are preferably produced by grinding the components in dry form, in moist form or in suspension, especially by salt kneading the components.

To produce pigment compositions in transparent form, the specific surface area should be above 40 $m^2/g$, preferably in the range from 40 to 180 $m^2/g$ and especially in the range from 60 to 160 $m^2/g$. Salt kneading is a preferred manufacturing operation for this.

The production of the pigment compositions of the present invention may further include colorants for shading and auxiliaries, examples being surfactants, pigmentary and nonpigmentary dispersants, fillers, standardizers, resins, waxes, defoamers, antidusters, extenders, antistats, preservatives, drying retarders, additives to control the rheology, wetting agents, antioxidants, UV absorbers, light stabilizers, binders, for example the binders of the system in which the pigment composition of the present invention is to be used, or a combination thereof. Shading components are typically used in amounts of up to 10% by weight and auxiliaries in up to ten fold amount, each based on the sum total of disazo pigment of formula (I) and organic orange, red or violet pigment. However, even higher amounts can be used in exceptional cases. The addition of the auxiliaries and of the shading colorants can take place at any stage of the process.

By fillers and extenders are meant a multiplicity of substances in accordance with DIN 55943 and DIN EN 971-1, for example the various types of talc, kaolin, mica, dolomite, lime, titanium dioxide, zinc sulfide, lithopones or barium sulfate. The addition particularly before a grinding operation of the pigment composition of the present invention will prove particularly advantageous.

The pigment compositions of the present invention may preferably be utilized as aqueous presscakes or moist granules, but generally they comprise solid systems of free-flowing, pulverulent constitution or else granules.

The pigment compositions of the present invention are useful for pigmentation of macromolecular organic materials of natural or synthetic origin, for example for pigmentation of plastics, resins, coatings, paints, electrophotographic toners and developers, electric materials, color filters and also inks, including printing inks, and seed.

Macromolecular organic materials which can be pigmented with the pigment compositions of the present invention are for example cellulose compounds, for example cellulose ethers and esters, such as ethylcellulose, nitrocellulose, cellulose acetates or cellulose butyrates, natural binders, for example fatty acids, fatty oils, resins and their conversion products, or manufactured resins, such as polycondensates, polyadducts, addition polymers and addition copolymers, such as for example amino resins, especially urea- and melamine-formaldehyde resins, alkyd resins, acrylic resins, phenoplasts and phenolic resins, such as novolaks or resoles, urea resins, polyvinyls, such as polyvinyl alcohols, polyvinyl acetals, polyvinyl acetates or polyvinyl ethers, polycarbonates, polyolefins, such as polystyrene, polyvinyl chloride, polyethylene or polypropylene, poly(meth)acrylates and their copolymers, such as polyacrylic esters or polyacrylonitriles, polyamides, polyesters, polyurethanes, coumarine-indene and hydrocarbon resins, epoxy resins, unsaturated manufactured resins (polyesters, acrylates) having various curing mechanisms, waxes, aldehydic and ketonic resins, gum, rubber and its derivatives and latices, casein, silicones and silicone resins; individually or in admixtures.

It is immaterial whether the macromolecular organic compounds mentioned are in the form of plastically deformable compositions, melts or in the form of spinning solutions, dispersions, coatings, paints or printing inks. Depending on the intended use, it will be advantageous to use the pigment compositions of the present invention as a blend or in the form of formulations or dispersions.

The pigment composition can also be produced in the course of being incorporated into the macromolecular organic medium.

The present invention accordingly also provides a macromolecular organic material comprising a coloristically effective amount of a pigment composition of the present invention.

Based on the macromolecular organic material to be pigmented, the pigment composition of the present invention is usually used in an amount of 0.01% to 30% by weight and preferably 0.1% to 15% by weight.

It is also possible in some cases to use a crude having a BET surface area of greater than 2 $m^2/g$ and preferably greater than 5 $m^2/g$ instead of the corresponding ground and/or finished pigment composition of the present invention. This crude can be used for producing color concentrates in liquid or solid form in concentrations from 5% to 99% by weight, alone or if appropriate in a mixture with other crudes or ready-produced pigments.

The pigment compositions of the present invention are also useful as a colorant in electrophotographic toners and developers, for example one- or two-component powder toners (also known as one- or two-component developers), magnetic toners, liquid toners, addition polymerization toners and also specialty toners. Typical toner binders are addition polymerization, polyaddition and polycondensation resins, such as styrene, styrene-acrylate, styrene-butadiene, acrylate, polyester, phenol-epoxy resins, polysulfones, polyurethanes, individually or in combination, and also polyethylene and polypropylene, which may each contain further ingredients, such as charge control agents, waxes or flow assistants, or may subsequently be modified with these additives.

The pigment compositions of the present invention are further useful as a colorant in powders and powder coatings, especially in triboelectrically or electrostatically sprayable powder coatings used for surface coating of articles composed for example of metal, wood, plastic, glass, ceramic, concrete, textile material, paper or rubber.

Useful powder coating resins typically include epoxy resins, carboxyl- and hydroxyl-containing polyester resins, polyurethane and acrylic resins together with customary hardeners. Combinations of resins can also be used. For instance, epoxy resins are frequently used in combination with carboxyl- and hydroxyl-containing polyester resins.

Typical hardener components (depending on the resin system) include for example acid anhydrides, imidazoles and also dicyandiamide and derivatives thereof, blocked isocyanates, bisacylurethanes, phenolic and melamine resins, triglycidyl isocyanurates, oxazolines and dicarboxylic acids. The pigment compositions of the present invention are also useful as a colorant in ink jet inks on an aqueous and nonaqueous basis, microemulsion inks and also in such inks as operate by the hot melt process.

Ink jet inks generally contain in total 0.5% to 15% by weight and preferably 1.5% to 8% by weight (reckoned dry) of one or more of the pigment compositions of the present invention.

Microemulsion inks are based on organic solvents, water and if appropriate an additional hydrotropic substance (interfacial mediator). Microemulsion inks contain in general 0.5% to 15% by weight and preferably 1.5% to 8% by weight of one or more of the pigment compositions of the present invention, 5% to 99% by weight of water and 0.5% to 94.5% by weight of organic solvent and/or hydrotropic compound.

Solvent-based ink jet inks contain preferably 0.5% to 15% by weight of one or more of the pigment compositions of the present invention, 85% to 99.5% by weight of organic solvent and/or hydrotropic compounds.

Hot melt inks are usually based on waxes, fatty acids, fatty alcohols or sulfonamides which are solid at room temperature and liquefy on heating, the preferred melting range being between about 60° C. and about 140° C. Hot melt ink jet inks consist for example essentially of 20% to 90% by weight of wax and 1% to 10% by weight of one or more of the pigment compositions of the present invention. They may further include 0% to 20% by weight of an additional polymer (as "dye dissolver"), 0% to 5% by weight of dispersing assistant, 0% to 20% by weight of viscosity modifier, 0% to 20% by weight of plasticizer, 0% to 10% by weight of tackifying additive, 0% to 10% by weight of transparency stabilizer (prevents crystallization of waxes, for example) and also 0% to 2% by weight of an antioxidant.

The pigment compositions of the present invention are further useful as a colorant for color filters, not only for additive but also for subtractive color generation, as for example in electro-optical systems such as television screens, liquid crystal displays (LCDs), charge coupled devices, plasma displays or electroluminescent displays, which in turn may be active (twisted nematic) or passive (supertwisted nematic) ferroelectric displays or light-emitting diodes, and also as a colorant for electronic inks ("e-inks") or electronic paper ("e-paper").

To produce color filters, not only reflecting but also transparent color filters, pigments are applied in the form of a paste or as a pigmented photoresist in a suitable binder (acrylates, acrylic esters, polyimides, polyvinyl alcohols, epoxides, polyesters, melamines, gelatins, caseins) to the respective LCD components (e.g. TFT-LCD=Thin Film Transistor Liquid Crystal Displays or for example ((S) TN-LCD=(Super) Twisted Nematic-LCD). As well as a high thermal stability, a high pigment purity is a prerequisite for a stable paste or a pigmented photoresist. In addition, the pigmented color filters can also be applied by ink jet printing processes or other suitable printing processes.

The pigment compositions of the present invention possess excellent coloristic and rheological properties, especially high flocculation stability, easy dispersibility, good rheology, high color strength and saturation (chroma). They are readily dispersible in many application media to very fine states of subdivision. Such pigment dispersions exhibit excellent Theological properties even at high pigmentation of the coating color concentrates. Similarly, the other abovementioned properties such as for example gloss, overcoating fastness, solvent fastness, alkali fastness, light and weather fastnesses and also cleanness of hue are very good. In addition, the pigment compositions of the present invention make it possible to provide hues in the yellowish red and orange region which is in demand for use in color filters. They provide very good contrast here. They can be produced with high purity and low levels of ions. As required, pigment compositions having high or low specific surface area having hiding or transparent masstones can be produced. The pigment compositions of the present invention exhibit excellent properties even when one component, particularly the yellow disazo pigment of the formula (I), is used only in relatively small amounts for tinting.

To evaluate the properties of the pigments in the coating sector in waterless, solventborne coating systems, an alkyd-melamine resin varnish based on a medium-oil alkyd resin and on a butanol-etherified melamine resin (AM) was selected from the multiplicity of existing coatings.

To evaluate the properties of the pigments in the coating sector in aqueous coating systems, an aqueous coating based on polyurethane (PU) was selected from the multiplicity of existing coating systems. The coloristic properties were determined in accordance with DIN 55986. Millbase rheology after dispersion was rated on the following five-point scale:

| | |
|---|---|
| 5 | thin |
| 4 | fluid |
| 3 | thick |
| 2 | slightly set |
| 1 | set |

Overcoating fastness was determined in accordance with DIN 53221. Viscosity was determined, following dilution of the millbase to the final pigment concentration, using a Rossmann viscospatula type 301 from Erichsen.

In the examples which follow, percentages and parts are by weight, unless otherwise stated.

The disazo pigment of the formula (I) was prepared as described in Example 2 of DE 100 45 790 A1.

EXAMPLE 1

18 g of C.I. Pigment Red 177 and 12 g of disazo pigment of formula (I) are mechanically mixed.

The pigment composition incorporates in AM varnish to give strong coatings of reddish orange hue.

EXAMPLE 2

90 g of sodium chloride, 9 g of C.I. Pigment Red 177.6 g of disazo pigment of the formula (I) and 17 ml of diethylene glycol are kneaded at 40° C. for 8 h. The kneaded mass is stirred into 200 ml of 5% aqueous hydrochloric acid at 40° C. for 2 h, the suspension is filtered, the presscake is washed salt free and dried at 80° C.

The pigment composition incorporates in AM varnish to give strong coatings of reddish orange and clean hue. Masstone is transparent.

EXAMPLES 3 to 8

The following mixtures were produced:

|  | Ex.3 | Ex.4 | Ex.5 | Ex.6 | Ex.7 | Ex.8 |
|---|---|---|---|---|---|---|
| Disazo pigment of formula (I) | 3 g | 6 g | 26.4 g | 21 g | 9 g | 18 g |
| P.O.43 | 26.4 g |  |  |  | 18 g |  |
| P.R.168 |  |  |  | 4.5 g |  |  |
| P.R.179 |  |  | 0.6 g |  |  |  |
| P.R.209 |  |  |  |  | 3 g |  |
| P.V. 19 |  | 4.5 g |  |  |  |  |
| P.R.122 |  |  | 3 g |  |  |  |
| P.O.62 |  | 19.5 g |  |  |  |  |
| P.O.36 |  |  |  |  |  | 7.5 g |
| P.R.188 |  |  |  | 3 g |  |  |
| P.R.170 |  | 0.6 g |  |  |  |  |
| P.R.264 |  |  |  |  | 1.5 g | 4.5 g |

Strong coatings are obtained in AM varnish which have orange to yellowish red hues.

EXAMPLE 9

25 g of C.I. Pigment Red 254, 4 g of C.I. Pigment Red 177 and 1 g of disazo pigment of formula (I) are mechanically mixed.

Strong coatings are obtained in AM varnish which have yellowish red hue and high gloss and low viscosity.

EXAMPLE 10

90 g of sodium chloride, 12.5 g of C.I. Pigment Red 254, 2 g of C.I. Pigment Red 177, 0.5 g of disazo pigment of formula (I) and 24.5 ml of diethylene glycol are kneaded are 40° C. for 8 h. The kneaded mass is stirred into 200 ml of (5% by weight) aqueous hydrochloric acid at 40° C. for 2 h, the suspension is filtered, the presscake is washed salt free and dried at 80° C.

The pigment composition incorporates AM varnish to give strong, transparent coatings of yellowish red hue and high gloss and low viscosity.

EXAMPLE 11a 450 g of sodium chloride, 75 g of disazo pigment of formula (I) prepared as described in Example 2 of DE 100 45 790 A1 and 110 ml of diethylene glycol are kneaded at 85° C. for 8 h. The kneaded mass is stirred into 4 liters of 5% by weight aqueous sulfuric acid at 40° C. for 2 h, the suspension is filtered, the presscake is washed salt free and dried at 80° C. to obtain 74 g of disazo pigment of formula (I).

EXAMPLE 11b 18 g of C.I. Pigment Red 254 and 2 g of disazo pigment of formula (I) prepared according to Example 11a are mechanically mixed.

EXAMPLE 12

15 g of C.I. Pigment Red 254, 3 g of C.I. Pigment Red 264 and 2 g of disazo pigment of formula (I) prepared according to Example 11a are mechanically mixed.

EXAMPLE 13

90 g of sodium chloride, 11.25 g of C.I. Pigment Red 254, 2.25 g each of C.I. Pigment Red 264, 1.5 g of disazo pigment of formula (I) prepared according to Example 11a and 24 ml of diethylene glycol are kneaded at 40° C. for 6 h. The kneaded mass is stirred into 500 ml of aqueous sulfuric acid (5% by weight) at 40° C. for 2 h, the suspension is filtered, the presscake is washed salt free and dried at 80° C.

Testing for Color Filters

Production of a Test Color Filter:

First a color filter paste is produced from pigment composition, binder, solvent and dispersing assistant in accordance with the following recipe:

| | |
|---|---|
| 77% by weight of | 1-methoxy-2-propyl acetate |
| 10% by weight of | styrene-acrylic polymer |
| 10% by weight of | pigment composition; and |
| 3% by weight of | dispersing assistant. |

The above mixture is dispersed with zircon balls (Ø 0.5-0.7 mm) in a paint shaker for 2 hours. The dispersion is subsequently filtered. The color filter paste obtained is spin-coated onto a glass substrate to produce a color filter film. The transparency, coloristic values, heat stability and contrast are determined on this color filter film.

The transmission of the coated glass substrate is determined spectro-photometrically in the use range of 400-700 nm. The coloristic values are described using the CIE color triangle (xyY values): x describes the blue-red axis, y the blue-green axis, Y the brilliance.

Viscosity is determined on the above-described color filter paste using a rotary viscometer at 23° C.±0.5° C. and a shear rate of 60 s$^{-1}$.

Heat stability is described by the delta E value; the delta E value is determined in accordance with DIN 6174, it describes the total color difference and can be calculated from the x, y, Y values. The coated glass substrate is heated at 80° C. for 10 min following measurement of the transmission. Then, the transmission is measured and delta E is calculated. The coated glass substrate is then heated at 250° C. for 1 h and a delta E value is determined again.

In addition, the color filter paste is used to produce a masstone coating and after thinning with a white paste a reduced coating, by knifecoating, the coloristics of each of which is assessed.

Testing for Color Filters with Pigment Composition of Example 11b:

A color filter paste is produced. The viscosity of the color filter paste is: η=12.8 mPa.s.

Then, 3 ml of the color filter paste are pipetted and applied by means of a spin coater to a glass substrate at a speed of 2500 rpm in the course of 20 s. The coloristic properties of the color filter film are subsequently determined by spectrophotometry.

Coloristic Values:

| x | y | Y |
|---|---|---|
| 0.581 | 0.327 | 22.1 |

Transmission Values:

| Wavelength | 400 nm | 410 nm | 420 nm | 430 nm | 440 nm | 450 nm |
|---|---|---|---|---|---|---|
| Transmission (%) | 23.4 | 17.7 | 12.9 | 9.1 | 6.4 | 4.7 |
| Wavelength | 460 nm | 470 nm | 480 nm | 490 nm | 500 nm | |
| Transmission (%) | 3.3 | 2.8 | 2.7 | 2.5 | 2.0 | |
| Wavelength | 510 nm | 520 nm | 530 nm | 540 nm | 550 nm | 560 nm |
| Transmission (%) | 2.1 | 2.6 | 2.9 | 1.5 | 0.7 | 1.0 |
| Wavelength | 570 nm | 580 nm | 590 nm | 600 nm | 610 nm | |
| Transmission (%) | 5.0 | 31.4 | 65.4 | 78.4 | 83.8 | |
| Wavelength | 620 nm | 630 nm | 640 nm | 650 nm | 660 nm | 670 nm |
| Transmission (%) | 86.3 | 87.0 | 86.9 | 86.5 | 86.0 | 85.9 |
| Wavelength | 680 nm | 690 nm | 700 nm | | | |
| Transmission (%) | 86.1 | 86.4 | 87.0 | | | |

Heat stability is good.

The coatings exhibit high transparency and color strength and a clean hue.

A color filter paste is produced. The viscosity of the color filter paste is:
η=23.2 mPa.s.

Then, 3 ml of the color filter paste are pipetted and applied by means of a spin coater to a glass substrate at a speed of 2500 rpm in the course of 20 s. The coloristic properties of the color filter film are subsequently determined by spectrophotometry.

Coloristic values:

| x | y | Y |
|---|---|---|
| 0.588 | 0.324 | 19.5 |

Transmission values:

| Wavelength | 400 nm | 410 nm | 420 nm | 430 nm | 440 nm | 450 nm |
|---|---|---|---|---|---|---|
| Transmission (%) | 20.3 | 15.5 | 11.3 | 7.9 | 5.6 | 4.1 |
| Wavelength | 460 nm | 470 nm | 480 nm | 490 nm | 500 nm | |
| Transmission (%) | 2.9 | 2.4 | 2.4 | 2.2 | 1.8 | |
| Wavelength | 510 nm | 520 nm | 530 nm | 540 nm | 550 nm | 560 nm |
| Transmission (%) | 1.8 | 2.2 | 2.2 | 1.4 | 0.7 | 0.8 |
| Wavelength | 570 nm | 580 nm | 590 nm | 600 nm | 610 nm | |
| Transmission (%) | 3.4 | 22.2 | 52.9 | 70.2 | 78.0 | |
| Wavelength | 620 nm | 630 nm | 640 nm | 650 nm | 660 nm | 670 nm |
| Transmission (%) | 82.1 | 84.3 | 85.7 | 86.4 | 86.6 | 86.6 |
| Wavelength | 680 nm | 690 nm | 700 nm | | | |
| Transmission (%) | 86.5 | 86.3 | 86.2 | | | |

Heat stability is good.

The coatings exhibit high transparency and color strength and a clean hue.

Testing for color filters with pigment composition of Example 13: A color filter paste is produced. The viscosity of the color filter paste is:
η=119.8 mPa.s.

Then, 3 ml of the color filter paste are pipetted and applied by means of a spin coater to a glass substrate at a speed of 2500 rpm in the course of 20 s. The coloristic properties of the color filter film are subsequently determined by spectrophotometry.

Coloristic Values:

| x | y | Y |
|---|---|---|
| 0.634 | 0.331 | 17.2 |

Transmission Values:

| Wavelength | 400 nm | 410 nm | 420 nm | 430 nm | 440 nm | 450 nm |
|---|---|---|---|---|---|---|
| Transmission (%) | 8.9 | 6.5 | 4.4 | 2.8 | 1.8 | 1.2 |
| Wavelength | 460 nm | 470 nm | 480 nm | 490 nm | 500 nm | |
| Transmission (%) | 0.8 | 0.6 | 0.5 | 0.5 | 0.4 | |
| Wavelength | 510 nm | 520 nm | 530 nm | 540 nm | 550 nm | 560 nm |
| Transmission (%) | 0.4 | 0.5 | 0.5 | 0.3 | 0.2 | 0.2 |
| Wavelength | 570 nm | 580 nm | 590 nm | 600 nm | 610 nm | |
| Transmission (%) | 0.5 | 11.3 | 44.1 | 68.3 | 79.1 | |
| Wavelength | 620 nm | 630 nm | 640 nm | 650 nm | 660 nm | 670 nm |
| Transmission (%) | 83.6 | 85.7 | 86.8 | 87.5 | 87.8 | 88.0 |
| Wavelength | 680 nm | 690 nm | 700 nm | | | |
| Transmission (%) | 88.1 | 88.1 | 88.2 | | | |

Heat stability is good.

The coatings exhibit high transparency and color strength and a clean hue.

What is claimed is:

1. A pigment composition comprising a disazo pigment of formula (I),

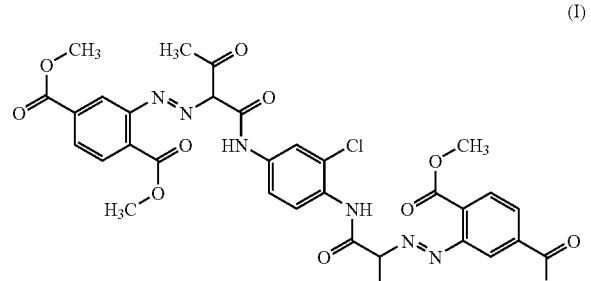

and one or more second pigments selected from the group of consisting of organic orange, red and violet pigments.

2. The pigment composition according to claim 1 wherein the organic orange pigment is C.I. Pigment Orange 5, 13, 14, 16, 34, 36, 38, 42, 43, 48, 49, 51, 61, 62, 64, 67, 68, 69, 71, 72, 73, 74; or a combination thereof.

3. A pigment composition according to claim 1 wherein the organic red pigment is C.I. Pigment Red 1, 2, 3, 4, 5, 7, 9, 12, 14, 23, 38, 41, 42, 48, 48:1, 48:2, 48:3, 48:4, 48:5, 48:6, 49, 49:1, 51:1, 52:1, 52:2, 53, 53:1, 53:3, 57, 57:1, 57:2, 57:3, 58:2, 58:4, 63:1, 81, 81:1, 81:2, 81:3, 81:4, 81:5, 81:6, 88, 112, 122, 123, 144, 146, 148, 149, 150, 166, 168, 169, 170, 175, 176, 177, 178, 179, 184, 185, 187, 188, 190, 192, 194, 200, 200:1, 202, 206, 207, 208, 209, 210, 214, 216, 220, 221, 224, 242, 246, 247, 251, 253, 254, 255, 256, 257, 260, 262, 264, 270, 272; or a combination thereof.

4. The pigment composition according to claim 1 wherein the organic violet pigment is C.I Pigment Violet 19.

5. The pigment composition according to claim 1, wherein the weight ratio of disazo pigment of formula (I) to the one or more second pigments is in the range from (0.1:99.9) to (99.9:0.1).

6. The pigment composition according to claim 1, wherein the weight ratio of disazo pigment of formula (I) to the one or more second pigments is in the range from (10:90) to (90:10).

7. The pigment composition according to claim 1, wherein the pigment composition is a solid solution or mixed crystal.

8. A process for producing a pigment composition according claim 1, comprising the step of mixing the disazo pigment of the formula (I) with the one or more second pigments.

9. A pigmented macromolecular organic material pigmented with a pigment composition according to claim 1.

10. A macromolecular organic medium comprising a coloristically effective amount of a pigment composition according to claim 1.

11. The pigmented macromolecular organic material according to claim 9, wherein the macromolecular organic material is selected from the group consisting of plastics, resins, coatings, paints, electrophotographic toners, electrophotographic developers, electric materials, color filters, inks, printing inks, ink jet inks, and seed.

* * * * *